United States Patent [19]

Matsushige et al.

[11] Patent Number: 5,414,571
[45] Date of Patent: May 9, 1995

[54] ADAPTIVE EQUALIZATION CIRCUIT FOR MAGNETIC RECORDING APPARATUS HAVING HIGH ERROR IMMUNITY

[75] Inventors: Hiromi Matsushige; Minoru Kosuge, both of Odawara; Yasuhiro Shimura, Hiratsuka; Hideki Miyasaka, Odawara; Satoshi Minoshima, Fujisawa; Tsuguji Tachiuchi, Odawara; Kazunori Iwabuchi, Yokohama; Terumi Takashi, Ebina; Naoto Matsunami, Fujisawa, all of Japan

[73] Assignee: Hitachi, Ltd., Tokyo, Japan

[21] Appl. No.: 961,623

[22] Filed: Oct. 16, 1992

[51] Int. Cl.$^6$ .................. G11B 5/35; H03H 7/30; H03H 7/40; H03K 5/159
[52] U.S. Cl. ........................ 360/65; 375/232
[58] Field of Search ................ 360/65, 32, 27, 46, 360/53, 40, 51, 39; 375/14; 333/28 R

[56] References Cited

U.S. PATENT DOCUMENTS

| | | | |
|---|---|---|---|
| 3,659,229 | 4/1972 | Milton | 375/14 X |
| 3,736,414 | 5/1973 | McAuliffe | 375/14 X |
| 3,792,356 | 2/1974 | Kobayashi et al. | 375/14 |
| 3,921,072 | 11/1975 | Sato | 375/14 |
| 3,979,677 | 9/1976 | Bagdasarjanz | 375/14 |
| 4,435,823 | 3/1984 | Davis et al. | 375/14 |
| 4,580,176 | 4/1986 | Graves et al. | 360/45 |
| 4,672,631 | 6/1987 | Suzuki et al. | 375/14 |
| 4,712,221 | 12/1987 | Pearce et al. | 375/14 |
| 5,060,088 | 10/1991 | Dolivo et al. | 360/46 |

Primary Examiner—Aristotelis Psitos
Assistant Examiner—Patrick Wamsley
Attorney, Agent, or Firm—Antonelli, Terry, Stout & Kraus

[57] ABSTRACT

A data reproducing circuit having a magnetic head for reading data from a recording medium, an adaptive equalization circuit for optimizing the waveform of a read signal, a discriminator circuit for discriminating an output signal of the adaptive equalization circuit and outputting a discriminated signal to an upper stage circuit, a format detecting circuit for detecting a pattern of signals written on the recording medium from outputs of the magnetic head, an expected value generating circuit for generating an expected value of the waveform of the read signal in accordance with an output of the adaptive equalization circuit and an output of the discriminator circuit, and an error detecting circuit for generating an error signal representing a difference between an output of the adaptive equalization circuit and an output of the expected value generating circuit. In the data reproducing circuit, the adaptive equalization characteristic of the adaptive equalization circuit is changed when a particular signal pattern on the recording medium is detected, allowing the adaptive equalization operation suitable for the recording medium.

8 Claims, 12 Drawing Sheets

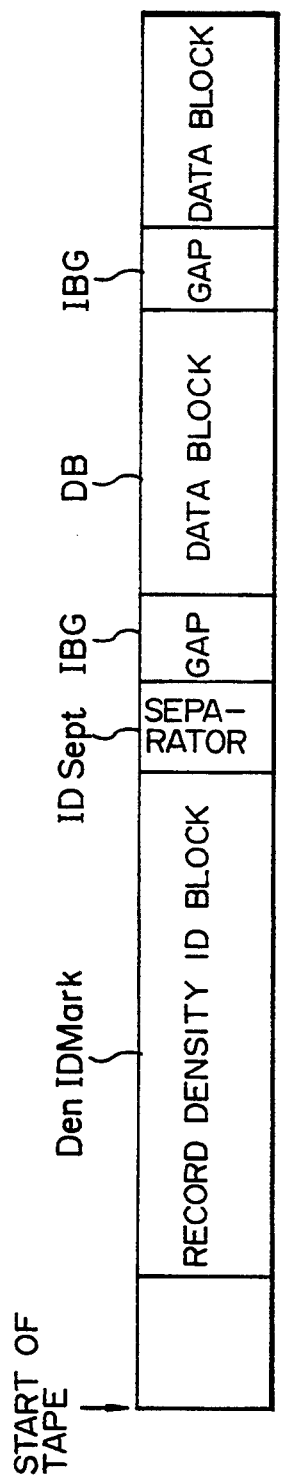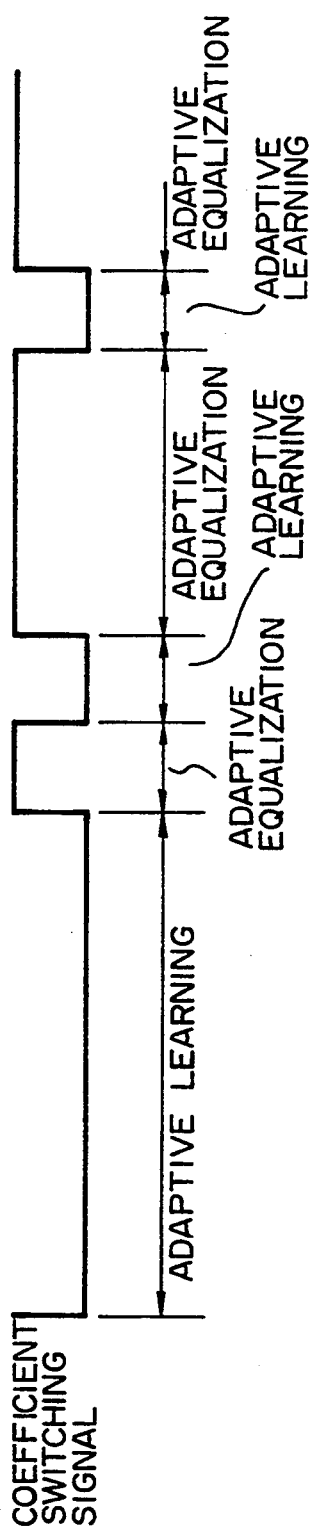
FIG. 4A
FIG. 4B

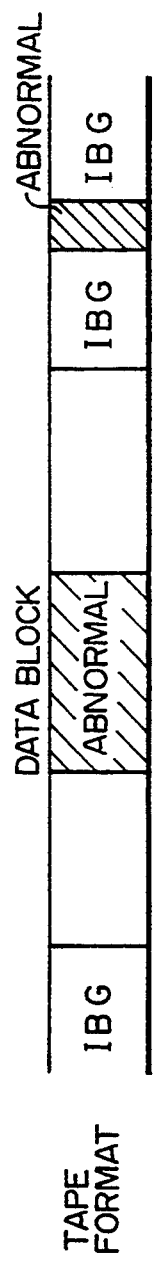
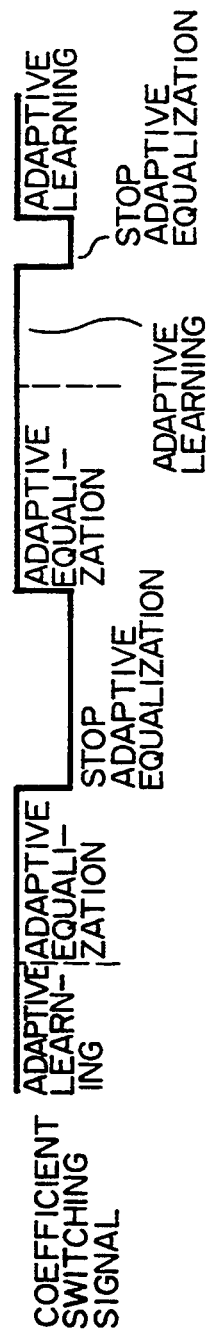
FIG. 7A
FIG. 7B

ADAPTIVE EQUALIZATION CIRCUIT FOR MAGNETIC RECORDING APPARATUS HAVING HIGH ERROR IMMUNITY

BACKGROUND OF THE INVENTION

1. Field of the Invention

The present invention relates to a data reproducing apparatus suitable for reproducing digitally recorded signals, and more particularly to a data reproducing apparatus having an adaptive equalizer and to an adaptive equalization control system.

2. Description of the Related Art

High density integration and high capacity are required more and more for digital signal reproducing apparatuses. For example, in a magnetic tape recording/reproducing apparatus, not only the line density is being improved, but also the number of tracks is increasing from 9 tracks, 18 tracks to 36 tracks. Such high density recording is required to satisfy strict data reproducing conditions, and it becomes important to correctly read data by equalizing the waveform of a reproduced signal.

A first conventional technique of solving such a problem as described in JP-A-2-7203, uses a waveform equalizing circuit.

According to a second conventional technique described in JP-A-1-112568, a magnetic change recorded on a magnetic recording medium is converted into an electric signal at an electromagnetic conversion system. The obtained reproduced signal is supplied to a waveform equalizing circuit and is read out to compensate for the frequency characteristic of the electromagnetic conversion system.

SUMMARY OF THE INVENTION

The present inventors have found the following problems of equalization circuits according to the conventional techniques.

1) With the first conventional technique, one of several equalization circuits is selected so as to follow a change in the running speed of a tape. Therefore, a change in other characteristics such as a change in the condition of matching with a tape, and a system secular change, can not be dealt with.

2) With the second conventional technique, a d.c. signal component can be suppressed. Therefore, this technique is suitable for reproducing data having a small interference between codes and a small bit error factor. However, this technique does not consider a change in the characteristic of the reproducing system.

3) Data reproduction from a multi-track is not considered. The frequency characteristic of the electromagnetic conversion system for a multi-track differs for each track because of manufacturing variation of magnetic heads. It is therefore important to adjust the frequency characteristic of an equalization circuit of each track for compensating for the frequency characteristic of each electromagnetic conversion system. If the number of tracks is large, the characteristics of equalization circuits vary greatly. If the adjustment of equalization circuits is insufficient, the read margin of the data reproducing apparatus becomes small, lowering the reliability of the apparatus. In addition, the tape matching quality becomes likely to affect the performance of the apparatus.

4) If reproduced data bits are is abnormal, it is impossible to discriminate between a poor adaptive equalization of an equalization circuit and an abnormal state of a reproducing system. It is therefore difficult to deal with an abnormal case.

5) In a magnetic recording/reproducing apparatus capable of reproducing data while running a magnetic tape in a forward or backward direction, the characteristic of the reproducing system changes between the forward and backward directions. This is not considered by the conventional techniques.

The present invention has been made under the above-described circumstances. It is an object of the present invention to provide a data reproducing apparatus having an adaptive equalization circuit or circuits capable of achieving the following objects.

1) An equalization circuit is made adaptive to a change in the characteristic of a data reproducing system. A multi-track is taken into consideration, a data read margin is expanded, and the reliability is improved.

2) Detecting an abnormal read state is made easy.

3) An equalization circuit is properly and easily made adaptive to different reproducing conditions, for example, adaptive to a switching between the forward and backward tape running directions.

4) The adaptive equalization function is stopped under an abnormal state to avoid an erroneous operation.

An "adaptive equalization circuit" is a kind of a filter which changes its characteristic so as to output the most desired waveform of an input signal, and changes its characteristic so as to follow a change in the quality of an input signal.

According to one aspect of the present invention, there is provided a data reproducing apparatus comprising:

means for reading data from a recording medium;

an adaptive equalization circuit for subjecting a signal read from the recording medium to an equalization process to optimize the waveform of the read signal;

a data discriminating circuit for discriminating an output signal of the adaptive equalization circuit and decoding the output signal into a data train of 0, 1, and −1;

a format detecting circuit for detecting a pattern of signals written on the recording medium from an output of the data reading means;

an expected value generating circuit for generating an expected value of the waveform of a read signal, in accordance with an output of the discriminating circuit and an output of the format detecting circuit; and an error detecting circuit for generating an error signal representing a difference between an output of the adaptive equalization circuit and an output of the expected value generating circuit and feeding back the error signal to the adaptive equalization circuit.

The adaptive equalization circuit optimizes the equalization condition by changing the coefficients set within this circuit to perform an equalization operation (hereinafter called an "adaptive equalization operation") of an input signal (signal read from a recording medium) whose waveform is to be optimized. The adaptive equalization circuit includes delay circuits for delaying an input signal, multipliers, coefficient circuits for determining multiplication coefficients (hereinafter called "adaptive coefficients") of the multipliers, and an adder for adding together outputs of the multipliers. The adaptive equalization operation by the adaptive equalization circuit is performed by changing the delay amount of an input signal by changing the adaptive coefficients.

The expected value generator circuit sets an optimum feedback value (hereinafter called an "expected value") to the adaptive equalization circuit for the adaptive equalization operation. As this expected value, a predetermined value is selected and outputted at the start of the adaptive equalization operation. As the adaptive equalization operation proceeds, the feedback value is generated in accordance with an output of the data discriminator circuit.

The set expected value is compared with an output of the adaptive equalization circuit by the error detecting circuit to generate an error signal. The generated error signal is inputted to the adaptive equalization circuit to change the adaptive coefficients.

The format detecting circuit detects a particular pattern of data read from the recording medium. The feedback is turned on or off in response to the detection result of the format detecting circuit. Namely, the error signal is connected to, or disconnected from, the adaptive equalization circuit by using a switch. In detecting a particular pattern, data initially written on a recording medium may be used. Such data may be density identification information written on a magnetic tape, IBG information between data blocks, or servo information for magnetic discs. While reading such data, the adaptive equalization operation is performed. The format detecting circuit detects an abnormal state of read data. If the read data are abnormal, the feedback is temporarily stopped, thereby preventing an adaptive equalization operation for an abnormal value.

A switching circuit is provided which changes the feedback percentage in accordance with an output of the format detecting circuit. It is desirable to change the feedback percentage when an output of the adaptive equalization circuit becomes approximately equal to or near the expected value. Namely, at the initial stage of the data reproducing operation, a large feedback percentage is used to speed up optimizing the adaptive coefficients. This operation is called an "adaptive learning" operation. When an output of the adaptive equalization circuit becomes approximately equal to or near the expected value, a small feedback percentage is used so as not to follow a temporary abnormal value of a read signal. This operation is simply called an "adaptive equalization" operation. The adaptive learning is one type of the adaptive equalization operation, the difference between them is whether the feedback percentage is large or small. These terms are discriminatively used in the following for the convenience of description. The adaptive learning operation is performed while reading the signal having the above-described particular pattern. The adaptive equalization operation is performed while reproducing the other user data areas.

In the data reproducing circuit of the present invention, there is also provided a setting circuit for setting different adaptive coefficients of the adaptive equalization circuit in accordance with the operation mode of the data reproducing circuit. The operation mode includes a mode with respect to one of several tracks of a magnetic tape, a mode of using a forward or backward magnetic tape running direction. Since the adaptive coefficients are changed in accordance with the operation mode, a more precise adaptive equalization operation becomes possible.

The operation of the data reproducing apparatus according to the present invention is as follows.

In reproducing data, a particular pattern of data initially written on a recording medium is used for checking the fundamental characteristic and learning adaptive coefficients of the adaptive equalization circuit. During this adaptive learning, a large feedback percentage is used, and the adaptive coefficients are optimized by using predetermined initial coefficients.

The particular pattern of record signals is detected for example from predetermined servo information. While a magnetic head reads the particular pattern of data, the adaptive coefficients are optimized and set to the adaptive equalization circuit.

In reproducing data recorded in a user area or the like, a small feedback percentage is used, and the adaptive equalization operation is performed based upon the adaptive coefficients obtained through the adaptive learning. Also during the period of reproducing the user area data, the coefficients are optimized. However, since the small feedback percentage is used, the coefficient values will not change greatly even if an abnormal signal is inputted, allowing data reproduction under the optimum condition.

During the adaptive learning operation or adaptive equalization operation, the monitor circuit monitors signals read by the data reading means and compares an error value of the read signals with a predetermined allowable value. If the error value is in excess of the allowable value, the read signal is considered as a temporary abnormal signal and the renewal of coefficients by the error signal at that time is temporarily stopped.

BRIEF DESCRIPTION OF THE DRAWINGS

FIGS. 4A and 4B show a format of a magnetic tape and a coefficient switching signal, used with the embodiment shown in FIG. 1;

FIGS. 7A and 7B illustrate abnormal states such as a block-out at a data block field and IBG field of a magnetic tape;

DESCRIPTION OF THE PREFERRED EMBODIMENTS

Embodiments of the present invention will be described with reference to the accompanying drawings. In order to help understand the data reproducing method providing an optimum adaptive equalization, the embodiments of the present invention are classified into the following first to fourth embodiments, and the characteristic feature of each embodiment will be clarified in the following.

1st Embodiment: an adaptive learning function for coefficients of an adaptive equalization circuit.

2nd Embodiment: a function of dealing with a multitrack.

3rd Embodiment: a function of detecting an abnormal state associated with an adaptive equalization circuit or waveform equalizer.

4th Embodiment: an adaptive equalization function of a bidirectional reproducing apparatus.

If all of the above embodiments are applied to a data reproducing apparatus, they ensure the most advantageous effects. However, they may be used singularly or in any desired combination.

Figure 1:
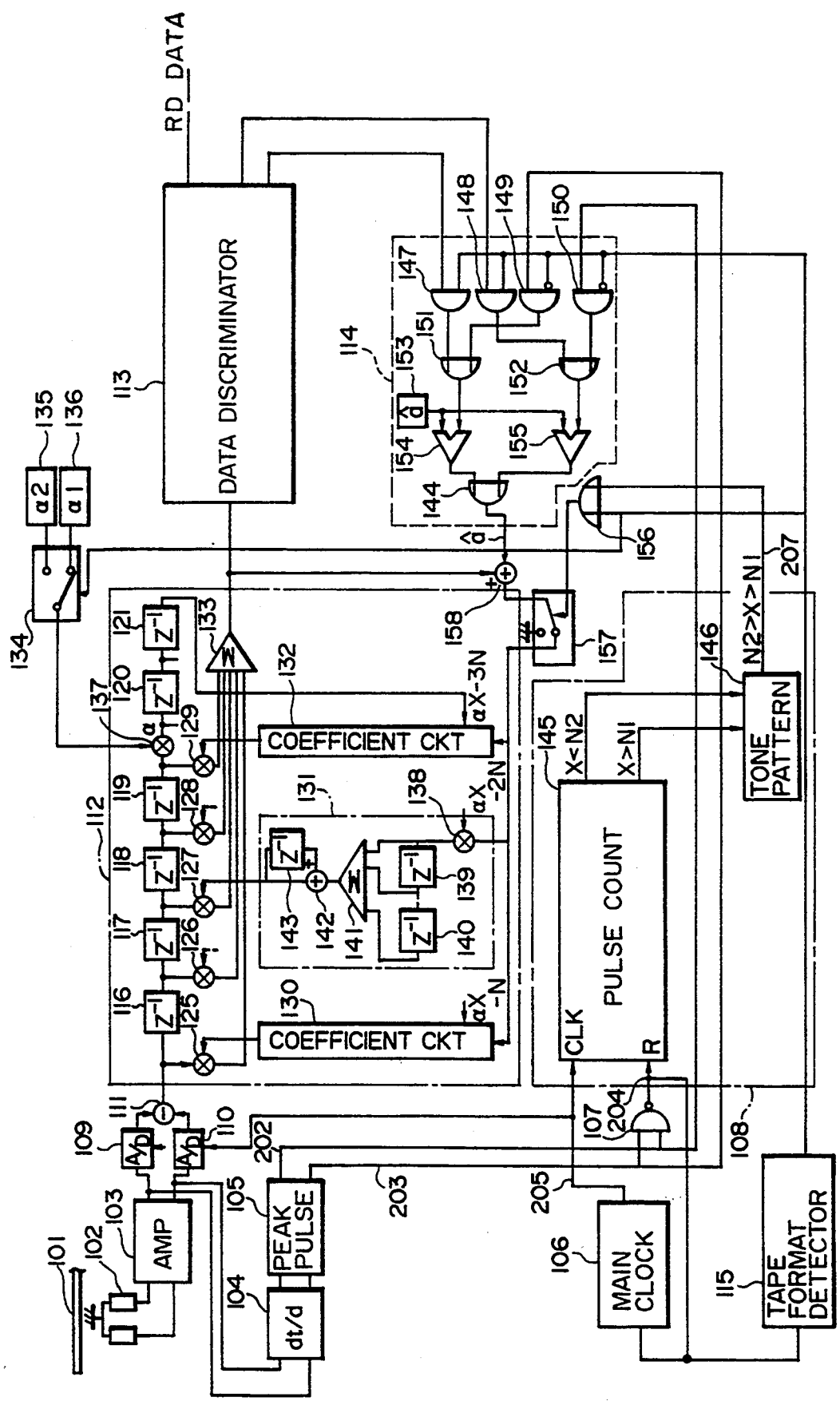
FIG. 1 is a block diagram showing the structure of a first embodiment of the present invention.

FIG. 1 shows the structure of the first embodiment of the present invention.

In FIG. 1, reference numeral 101 represents a recording medium or magnetic tape. Reference numeral 102 represents a read head. Reference numeral 103 represents a pre-amplifier. Reference numeral 104 represents a differentiating amplifier. Reference numeral 105 represents a peak pulse generator. Reference numeral 106 represents a main clock generator for generating clock signals whose phase is synchronous with the phase of a transition point of a peak pulse. Reference numeral 107 represents a NAND gate (or can be substituted with a logically equivalent NOR gate). Reference numeral 108 represents a peak pulse interval monitor. Reference numerals 109 and 110 represent analog/digital converters (A/D converters). Reference numeral 111 represents a subtracter. Reference numeral 112 represents an adaptive equalization circuit. Reference numeral 113 represents a data discriminator. Reference numeral 114 represents an expected value generator for generating an expected value of the adaptive equalization circuit. Reference numeral 115 represents a tape format detector.

The characteristics of the adaptive equalization circuit 112 can be changed, and this circuit performs an adaptive equalization process for signals read from the recording medium. Reference numerals 116 to 121 represent delay circuits for delaying inputted data, the delay circuit being formed by a latch circuit or the like. Reference numerals 125 to 129 represent multipliers, reference numerals 130 to 132 represent coefficient circuits for determining the coefficients of the multipliers, and reference numeral 133 represents an adder for adding together all signals passed through the delay circuits 116 to 119 and multipliers 125 to 129. With these circuits, the adaptive equalization circuit 112 performs an adaptive operation by using the determined coefficients. A resultant signal after the adaptive operation is used as an error signal to be fed back.

The data discriminator 113 discriminates the output data of the adaptive equalization circuit 112 and outputs data "1", "0", or "−1", by using the optimum decoding method disclosed for example in U.S. Pat. No. 5,231,544 issued Jul. 27, 1993, to Hiromi Matsushige. The output data are supplied as the data (RD DATA) read from the magnetic tape 101 to a reproducing system (not shown) including a decoder circuit.

The expected value generator 114 generates an expected value a by using outputs of the peak pulse generator 105 and outputs of the data discriminator 113. This expected value a represents the waveform of an output signal of the adaptive equalization circuit 112. Reference numeral 158 represents an error detector (adder) for outputting an error signal by comparing an output of the equalization circuit 112 with the expected value a.

Reference numerals 135 and 136 represent feedback coefficient circuits each setting a feedback coefficient $\alpha$ which determines a percentage of error feedback. Reference numeral 134 represents a coefficient switching circuit for switching between these error feedback coefficients, and reference numeral 137 represents a multiplier. With these circuits, a percentage of feedback to the adaptive equalization circuit is determined. The larger the feedback percentage, the more the adaptive operation of the equalization circuit 112 is affected. The smaller the feedback percentage, the less the adaptive operation is affected, for example, the response speed becomes slow.

The coefficient circuits 130, 131, and 132 have the same structure the detail of which is shown as the coefficient circuit 131 in FIG. 1. Reference numeral 138 represents a multiplier, and reference numerals 139 and 140 represent delay circuits for delaying data. Reference numeral 141 represents an adder which adds a signal having passed through the delay circuits 139 and 140 to an output of the multiplier 138. The delay circuits 139 and 140 and adder 141 constitute an FIR type filter. Each error signal passed through the FIR filter is supplied via an adder 142 and delay circuit 143 to each of the multipliers 125 to 129, to thereby renew coefficients.

Figure 2:
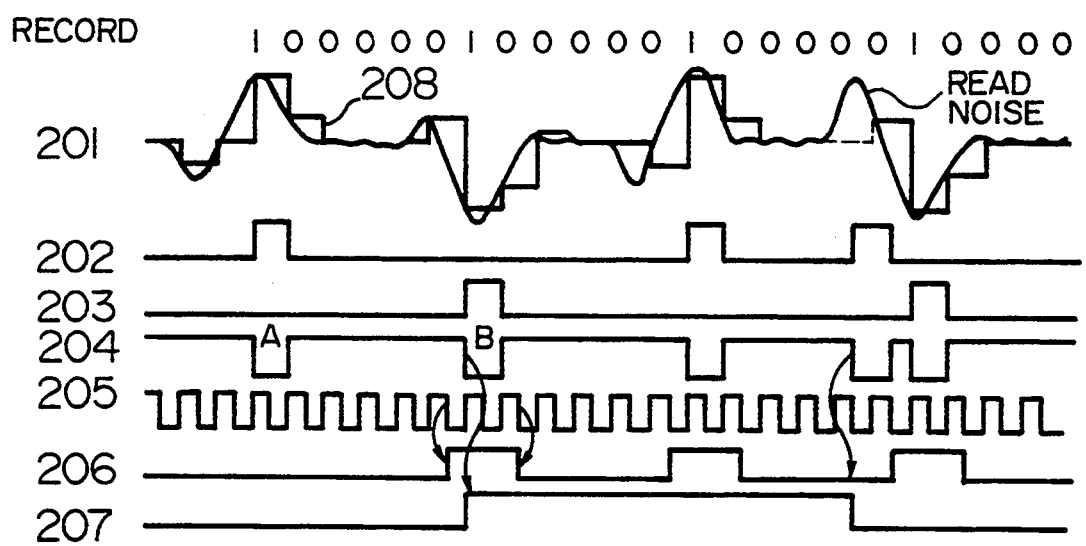
FIG. 2 is a timing chart illustrating the operation of the peak pulse interval monitor used with the embodiment shown in FIG. 1.

The peak pulse monitor 108 counts up main clock signals 205 starting from a particular position (indicated at A in FIG. 2) of the peak pulse 204 outputted from the NAND gate 107, and generates a window signal 206 for detecting the period of a particular pattern recorded on the magnetic tape. The peak pulse monitor 108 outputs a tone pattern (repetitive period pattern 1000001000001) signal 207 which takes an "H" level if the next peak pulse 204 is within the window and takes an "L" level if not. Namely, the interval value X of peak pulses 204 judges whether the interval of peak pulses of a particular pattern of input data is within the range from the lower limit interval N1 and upper limit interval N2. The tone pattern signal as well as an output signal from the tape format detector 115 is inputted to an NOR gate 156. Accordingly, the peak pulse monitor 108 monitors a periodicity by detecting an interval of peak pulses relative to a reference clock as shown in FIG. 2.

The expected value generator 114 has four AND gates 147, 148, 149, and 150 and two OR gates 151 and 152. These logical gates receive an output signal from the tape format detector 115, and selectively output either a peak pulse or an output from the data discriminator. The former peak pulse is selected while a density identification mark (Den ID Mark) or an interblock gap (IBG) between data blocks is detected. The expected value generator 114 has a memory 153 and selector circuits 154 and 155. Positive and negative expected values â are read from the memory 153 at the timing synchronous with the signal selected by the expected value generator 114. The expected value generator can be further divided into a first and second expected value generator, with the first expected value generator including, for example, the dam discriminator 113, logical gates 147–148, 151 and circuits 153–154, and the second expected value generator including logical gates 149–150, 152 and circuits 153 and 155.

Next, the operation of the first embodiment will be described with reference to FIGS. 1 to 4.

Data recorded on the magnetic tape 101 are sent via the read head 102 and pre-amplifier 103 to the differential type A/D converters 109 and 110 and to the differentiating circuit 104. The differential type A/D converters 109 and 110 quantize the input signals at the interval of main clock signals whose phase is synchronous with the peak value of the input data signal. The quantized digital signals are transformed into a single signal by the subtracter 111, and thereafter the waveform of this single signal is shaped (equalized) by the transversal type filter constructed of the delay circuits 116 to 119, multipliers 125 to 129, and adder 133. The equalized signal is then outputted from the equalization circuit 112. This signal is then discriminated by the data discriminator 113 as one of "1", "0", and "−1".

The differentiating circuit 104 generates differentiated waveform signals which zero-cross at peaks of the analog waveform data signal, and sends them to the peak pulse generator 105. The peak pulse generator 105 generates a peak pulse 202 having a predetermined pulse width when the analog signal has a positive peak, and generates a peak pulse 203 having the predetermined pulse width when the analog signal has a negative peak. The peak pulses are sent via the NAND gate 107 to the peak pulse interval monitor 108 and main clock generator 106.

The main clock generator 106 generates a clock signal whose phase is synchronous with the transition points of the peak pulses, and sends the signal to the peak pulse interval monitor 108 and A/D converters 109 and 110.

The peak pulse interval monitor 108 monitors the interval of peak pulses by using main clocks, and sets an "H" level for a peak pulse within the window and an "L" level for a peak pulse outside the window. In this manner, it is possible to judge from the interval X of peak pulses whether the interval of peak pulses of a particular pattern of input data is within the range from the lower limit interval N1 and upper limit interval N2.

Data recorded on the magnetic tape will be described with reference to FIGS. 4A and 4B. The magnetic tape has a data format shown in FIG. 4A. Specifically, a density identification mark (Den ID Mark) field, ID separator mark (ID Sept Mark) field, IBG field, data block (DB) field, IBG field, DB field, ... are formed in this order. The tape format detector 115 outputs an "H" level while detecting the density identification mark or IBG between DB fields, and outputs an "L" level in other cases. The tone pattern signal 207 is inputted to the OR gate 156. The object of the peak pulse monitor 108 is to change the characteristics of the adaptive equalization circuit 112, by renewing the coefficients by supplying the error signal only when a correct expected value is obtained, through adaptive learning of density identification marks and IBGs. Since the data of density identification marks and IBGs are known beforehand, they are suitable for use as adaptive learning signals.

The "L" level signal from the tape format detector 115 is sent to the NOR gate 156, coefficient switching circuit 134, and expected value generator 114. When the "L" level signal is inputted to the expected value generator 114, the peak pulses are selected and the corresponding expected value a is outputted. When the "H" level signal is inputted to the expected value generator 114, the output data "1", "0", and "−1" are selected and the corresponding expected value a is outputted. The error detector 158 outputs an error signal representative of a difference between the expected value signal and an output of the adaptive equalization circuit 112. This error signal is sent to a gate circuit 157.

When the "L" level signal is sent to the coefficient switching circuit 134, the coefficient switching circuit 134 is switched to the state shown in FIG. 1 to select the feedback coefficient 136 having a large feedback percentage $\alpha 1$. This large feedback percentage $\alpha 1$ is multiplied by the input signal passed through the delay circuits 116 to 119 at the multiplier 137, and fed back to the coefficients circuits 130, 131, and 132 via the delay circuits 120 and 121.

When the peak pulse monitor 108 detects an abnormal signal other than an ordinary tone pattern, the gate 157 is closed in response to a signal from the NOR gate 156 to stop renewing the coefficients. Therefore, the characteristic of the adaptive equalization circuit 112 remains unchanged.

An output signal from the adaptive equalization circuit 112 takes ideally the same value as the expected value signal. However, in practice, this output differs from the expected value signal. A signal multiplied by the large feedback percentage $\alpha 1$ at the multiplier 137 is fed back to the coefficient circuits 130, 131, and 132, and multiplied by the error signal from the error detector 158 at each multiplier 138 of each of the coefficient circuits 130, 131, and 132. The multiplied resultant signal then passes through the filer constructed of the delay circuits 140 and 139 and adder 141, and the adder 142 and delay circuit 143 output a new coefficient value which is obtained by adding or subtracting the error signal to or from the previous coefficient value. The new coefficient values are multiplied by the input/output signals of the delay circuits 116 to 129 at the multipliers 125 to 129, and the multiplied resultant signals are supplied to the adder 133 which delivers an output signal of the equalization circuit 112.

Figure 3:
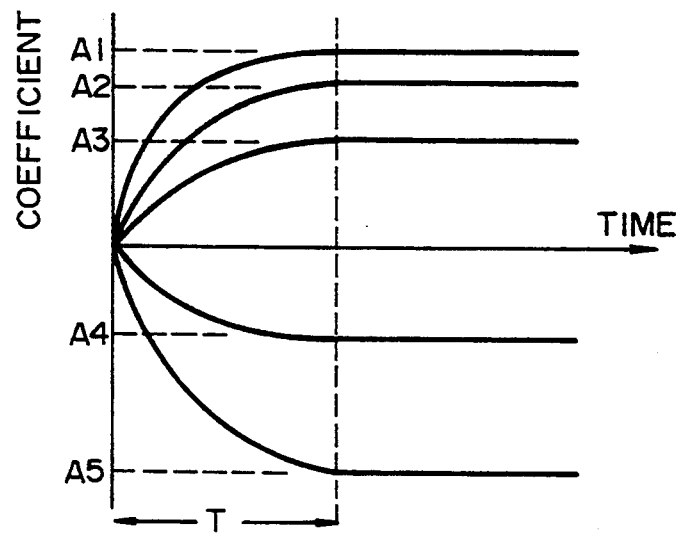
FIG. 3 is a graph showing a change of coefficients with time through adaptive learning.

The coefficient values of the coefficient circuits 130 to 132 change greatly at the initial period of adaptive learning by the equalization circuit 112 as shown in FIG. 3, because of a large difference between an output of the equalization circuit 112 and the expected value. As the adaptive operation of the equalization circuit 112 proceeds and an output therefore becomes near the expected value, the coefficients change less. After the coefficients are renewed repetitively in accordance with the error signal representing a difference between an output of the equalization circuit and the expected value obtained basing upon the output signals 202 and 203 from the peak pulse generator 105, the error signal becomes small and the coefficients are no more changed. In this manner, the coefficient A1 for the coefficient circuit 130 and the coefficient A2 for the coefficient circuit 131 B are definitely determined for example.

The adaptive learning time T is a time required for the coefficients to stop changing. The adaptive learning is performed while reading the density identification mark or IBG.

If an abnormal peak pulse is detected by the peak pulse generator 105, this generator outputs an "L" level signal which is inputted via the NOR gate 156 to the gate circuit 157. The gate circuit 157 is then closed, the contact of this circuit being switched to the side opposite to the state shown in FIG. 1, so that the coefficients will not be renewed by using the error signal.

While the read head 102 reads the data block DB shown in FIG. 3, the tape format detector 115 outputs the "H" level signal which is supplied to the NOR gate 156, expected value generator 114, and coefficient switching circuit 134. When the "H" level signal is inputted to the NOR gate 156, the gate circuit 157 changes its contact to the state shown in FIG. 1.

In response to the "H" level signal, the expected value generator 114 selects discriminated data from the data discriminator 113, whereas the coefficient switching circuit 134 changes its contact to the state opposite to the state shown in FIG. 1 to select a small feedback percentage $\alpha 2$. The reason for this is as follows. After completion of adaptive learning, the equalization circuit 112 has obtained an optimum equalization absorbing variation between recording media, heads and the like. Therefore, an error signal outputted from the error detector 158 is small. If a large error signal is outputted, this signal is discarded by judging it temporary noises.

With the small feedback percentage $\alpha 2$ being selected, a temporary large error signal is suppressed by the multiplier 138, preventing the coefficient values of the coefficient circuits 130 to 132 from being changed greatly. In the case of a drop-out where a large error signal is generated continuously, the error is gradually fed back to the coefficient circuits 130 to 132 regardless of the small feedback percentage $\alpha 2$. In this manner, an optimum operation is ensured so that after the adaptive learning is completed, a temporary noise signal is neglected and a continuous large error signal such as in the case of a drop-out is taken into consideration.

The above-described embodiment has the following advantageous effects.

(1) Adaptive learning is performed using normal expected value signals while referencing density identification marks and IBGs of the magnetic tape format. For the data field, an expected value signal generated basing upon an output from the data discriminator 113 is used. Even the data recorded on the first data field can be read under the optimum adaptive equalization condition.

(2) During the adaptive equalization, while performing a gentle equalization operation by selecting a small coefficient $\alpha 2$, data are read and reproduced. Accordingly, even if a temporary erroneous expected value generated basing upon the timings of discriminated data, occurs because of a drop-out or the like, a malfunction of the adaptive equalization circuit 112 will not occur.

(3) The adaptive equalization circuit of this embodiment has the peak pulse monitor 108. Therefore, the adaptive learning operation can be temporarily stopped when an input signal having an abnormal tone pattern is received, preventing the adaptive learning operation from following the abnormal input signal.

In this embodiment, the adaptive equalization operation is carried out after the adaptive learning, by using particular patterns of formatting signals recorded on the magnetic tape. The present invention is not limited to this embodiment only, but various modifications are possible without departing from the gist of the present invention. For example, the present invention is applicable to other magnetic recording/reproducing apparatuses such as optical discs.

Next, the second embodiment of the present invention will be described.

Figure 5A:
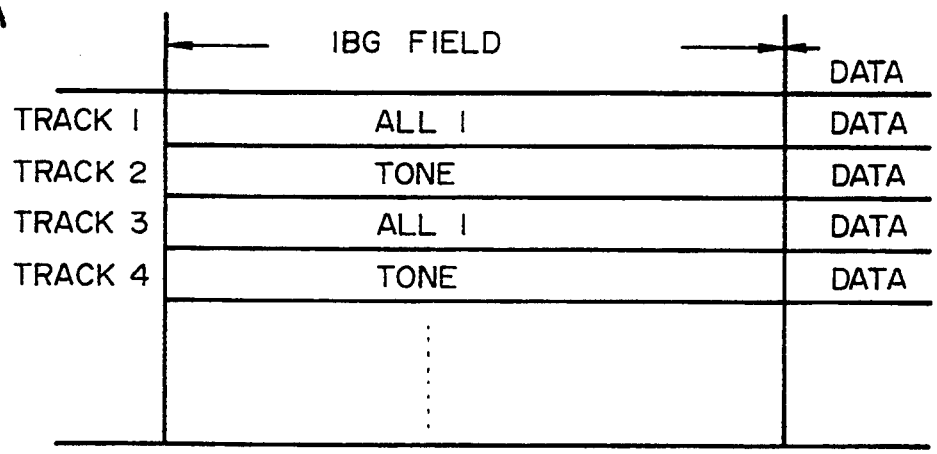
FIGS. 5A and 5B show the contents recorded on an interblock gap between data blocks of a magnetic tape, and its track switching signal.
Figure 6:
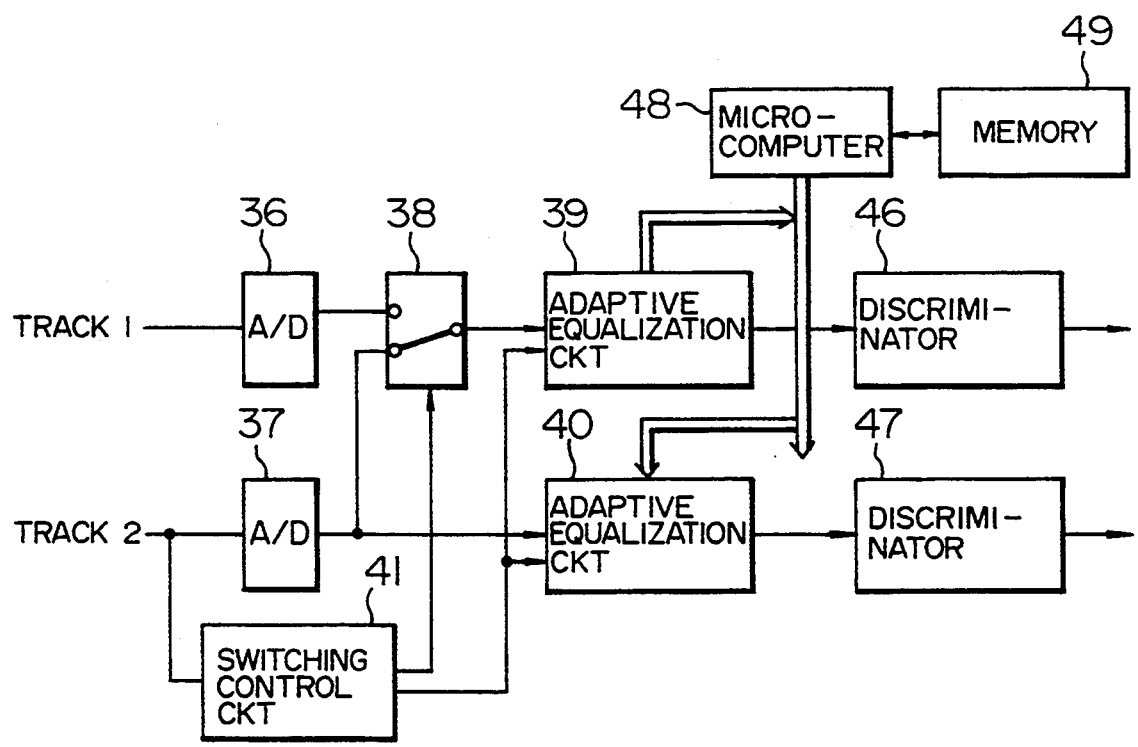
FIG. 6 is a block diagram showing a data reproducing apparatus for a magnetic tape recording/reproducing apparatus according to a second embodiment of the present invention.

This embodiment is suitable for use in reproducing data recorded on a magnetic tape having a specific format. FIG. 5A shows the contents of data recorded on a magnetic tape at the IBG field between data blocks. A magnetic tape has generally a plurality of tracks. Each track has IBG fields. For example, an odd numbered track is called "all 1s", and a logic "1" is recorded continuously. An even numbered track is called a tone pattern, and a repetitive signal of data "1000001" is recorded. For the odd numbered track of a magnetic tape having such a format, a learning of coefficients to be used for waveform equalization cannot be performed. To solve this problem, this embodiment has, as shown in FIG. 6, a first track A/D converter 36, second track A/D converter 37, track switching circuit 38, and adaptive equalization circuits 39 and 40 for the even and odd tracks.

The adaptive equalization operation by the adaptive equalization circuits 39 and 40 is the same as described with the first embodiment shown in FIG. 1, and so the detailed description thereof is omitted. A switching controller 41 is provided with a tape format detecting function similar to the first embodiment shown in FIG. 1.

Figure 5B:
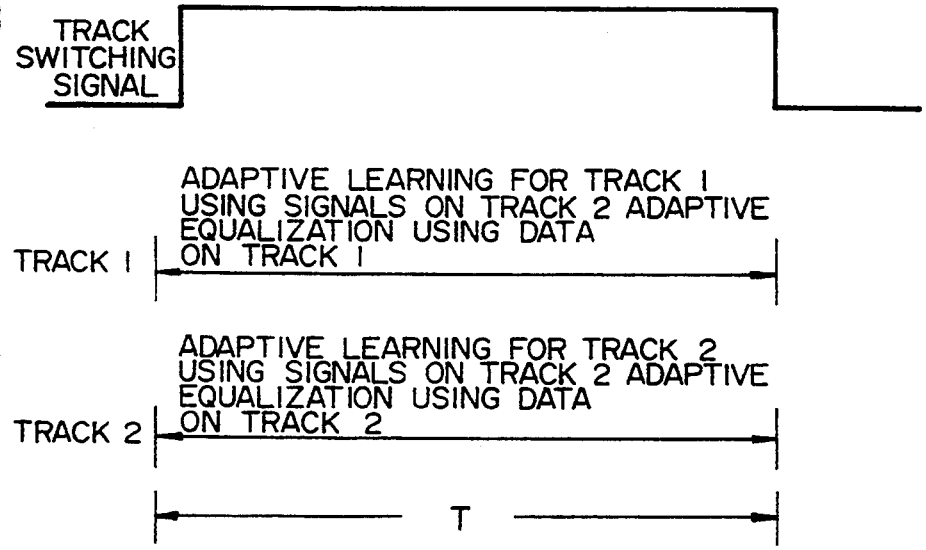

The track switching controller 41 detects the IBG field of a magnetic tape by detecting a combination of the tone pattern signals and a pattern of all logical 1's recorded before a data block. As shown in FIG. 5B, the track switching controller 41 supplies as a track switching signal a level "1" signal to the track switching circuit 38. In response to the level "1" track switching signal, the track switching circuit 38 changes its contact to the state shown in FIG. 6. Therefore, a signal from the second track A/D converter 37 is inputted to the first track adaptive equalization circuit 39. Then, the tone pattern signal recorded on the second track shown in FIG. 5A is inputted to the first track adaptive equalization circuit 39 to perform the adaptive learning operation. After the time period T sufficient for the adaptive equalization operation to be completed, the switching controller 41 outputs a "0" level signal and the track switching circuit 38 changes its contact to the state opposite to the state shown in FIG. 6. Therefore, the data signal recorded on the first track shown in FIG. 5A is inputted to the first track adaptive equalization circuit 39. Thereafter, an adaptive equalization operation is carried out for the data signal of each track.

In the above manner, the track switching circuit 38 operates to input a tone pattern signal to the adaptive equalization circuit which otherwise receives the all "1's" signal, to thereby allow the adaptive learning operation. After the completion of the adaptive learning operation by the first and second adaptive equalization circuits 39 and 40, the adaptive equalization operation is carried out by using the small feedback percentage $\alpha 2$ similar to the first embodiment. In this embodiment, setting the feedback percentage is made by a microcomputer 48.

In order to speed up the adaptive learning by the adaptive equalization circuits 39 and 40, the coefficient values may be stored in a memory 49, and these values are read at the time of adaptive learning and set as initial coefficient values. Furthermore, without providing the switching circuit 38, the coeffficient value obtained by the adaptive learning of the tone pattern signal recorded on the second track may be stored beforehand in the memory 49 and supplied to the first adaptive equalization circuit 39 under the control of the microcomputer 38.

With the above configuration, it is possible to shorten the time required for the adaptive learning, while ensuring an optimum adaptive equalization for a magnetic tape having a new format. The reason the time period is shortened is that the initial coefficients stored in advance are determined while considering a variation of the characteristics of heads and so the adaptive learning can start at the intermediate points of the curves shown in FIG. 3.

As the memory 49, a non-volatile memory such as a floppy disc may be used. In this case, upon turning on the power of the data reproducing apparatus, the initial coefficients can be set.

Next, the third embodiment of the present invention will be described with reference to FIGS. 7 to 9, the third embodiment being provided with a function of detecting an abnormal state associated with an adaptive equalization circuit.

FIGS. 7A and 7B are diagrams illustrating an operation when an abnormal state such as a drop-out is detected while reading DBs and IBGs of a magnetic tape.

Consider now the case wherein the adaptive learning is being executed by reading the density identification mark signal with the apparatus shown in FIG. 1 and by selecting the large feedback percentage $\alpha 1$. If an abnormal state such as a drop-out occurs during the adaptive learning, a change in the coefficients for the multipliers 125 to 129 is not monotonic as shown in FIG. 9. For example, the coefficient values increase and decrease greatly. In some cases the coefficient values become in excess of a predetermined value. In this embodiment, if an error signal ej exceeds a predetermined value 1A which is a maximum allowable value of the error signal ej during the adaptive learning operation, the adaptive learning operation is temporarily stopped. If an error signal ej exceeds a predetermined value 2A which is a maximum allowable value of the error signal ej during the adaptive equalization operation, the adaptive equalization operation is temporarily stopped.

Figure 8:
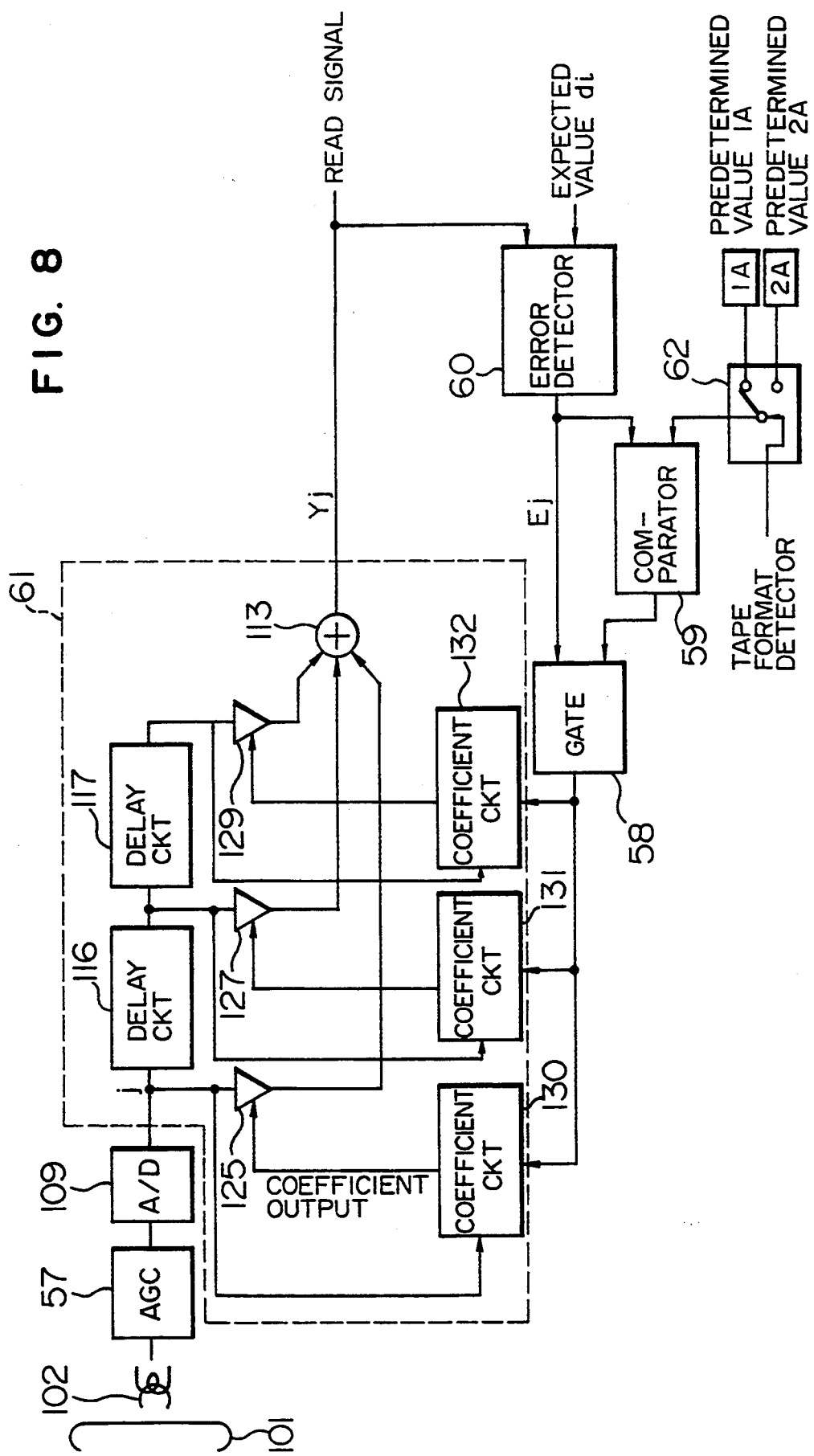
FIG. 8 is a block diagram showing the structure of a third embodiment according to the present invention.
Figure 9:
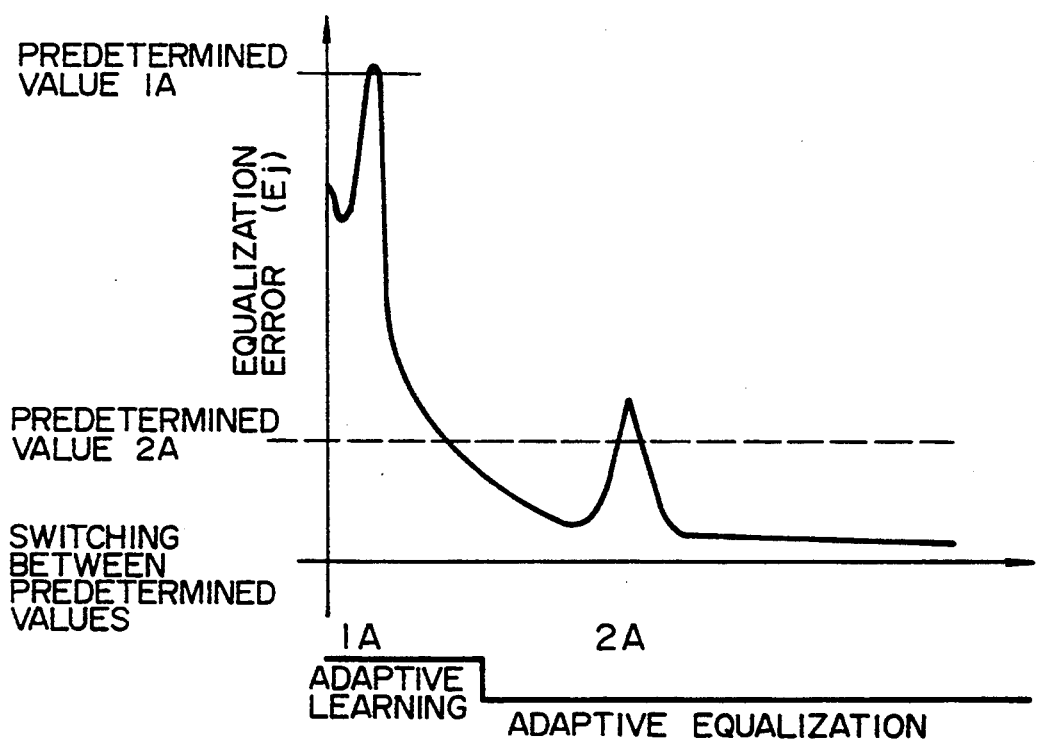
FIG. 9 is a graph showing a change of an error signal with time when an abnormal state occurs.

FIG. 8 is a block diagram showing a data reproducing apparatus realizing the above-described function. Reference numeral 101 represents a magnetic tape. Reference numeral 102 represents a magnetic head. Reference numeral 57 represents an automatic gain controlled (AGC) amplifier. Reference numeral 109 represents an analog/digital (A/D) converter. Reference numeral 61 represents a transversal equalization circuit. Reference numerals 130 to 132 represent coefficient renewing circuits. Reference numeral 60 represents an error signal generator for generating an error signal representing a difference between an output signal from the equalization circuit and an expected value. Reference numeral 59 represents a comparator for comparing, during the initial stage of the adaptive learning operation or during the adaptive equalization operation, an error signal outputted from the error detector 60 with the predetermined maximum allowable value 1A or 2A. Reference numeral 58 represents a gate circuit which is opened or closed in response to the comparison result by the comparator 59. With this data reproducing apparatus constructed as above, the error signal is monitored to temporarily stop the adaptive learning operation or adaptive equalization operation if the error signal becomes in excess of the predetermined maximum allowable value 1A or 2A.

The operation of this embodiment will be described below. First, an output Xj of the A/D converter for an input signal at time Tj is inputted to the adaptive equalization circuit 61 having the transversal filter. An output of the equalization circuit 61 is then inputted to the error detector 60 which outputs an error signal ej representing a difference between the equalized output Yj and its expected value dj.

The error signal ej is then inputted to the comparator 59 and compared with the maximum allowable value 1A of initial error signals during the adaptive learning operation, or with the maximum allowable value 2A of error signals during the adaptive equalization operation. The error signal ej is also inputted to the gate circuit 58 which is gated in response to an output of the comparator 59. Specifically, as shown in FIG. 9, when the error signal ej during the adaptive learning operation is larger than the predetermined value 1A, or when the error signal ej during the adaptive equalization operation is larger than the predetermined value 2A, the gate circuit 58 is closed so that no signal is outputted from the gate circuit 58. On the other hand, if the error signal ej is equal to, or smaller than, the predetermined value 1A or 2A, the gate circuit 58 opens and the error signal ej is outputted therefrom.

An output of the gate circuit 58 is supplied to the coefficient circuits 130 to 132 which renew the coefficients in accordance with the algorithm described with the first embodiment shown in FIG. 1, to thereby change the equalization characteristics of the equalization circuit 61. During the period while the gate circuit 58 is closed and no signal is outputted therefrom, it is considered that an output of the equalization circuit 61 is optimized, and so the characteristics of the equalization circuit 61 are not changed. Accordingly, the adaptive learning operation and adaptive equalization operation match the input signal Xj equal to, or smaller than, the predetermined values 1A and 2A, without matching the input signal Xj larger than the maximum allowable values. It is therefore possible to prevent an erroneous adaptive learning or equalization operation to be caused by a drop-out (e.g., temporary large error signal) or the like.

In this embodiment, instead of the error signal ej, the value of an envelope of a read-out signal may be monitored to stop the adaptive learning or equalization operation only when the envelope amplitude becomes smaller than a predetermined value.

An abnormal state may be detected by reading and comparing coefficients at a plurality of coefficients circuits. In the embodiment shown in FIG. 8, only three coefficient circuits 130 to 132 are used for the simplicity of description. However, in practice, a number of coefficient circuits are used so that an abnormal state can be easily detected by comparing coefficients of these circuits.

Next, the fourth embodiment of the present invention will be described. In this embodiment, described is a data reproducing apparatus, and more a magnetic tape data recording and reproducing apparatus capable of running the tape in opposite directions.

Figure 10:
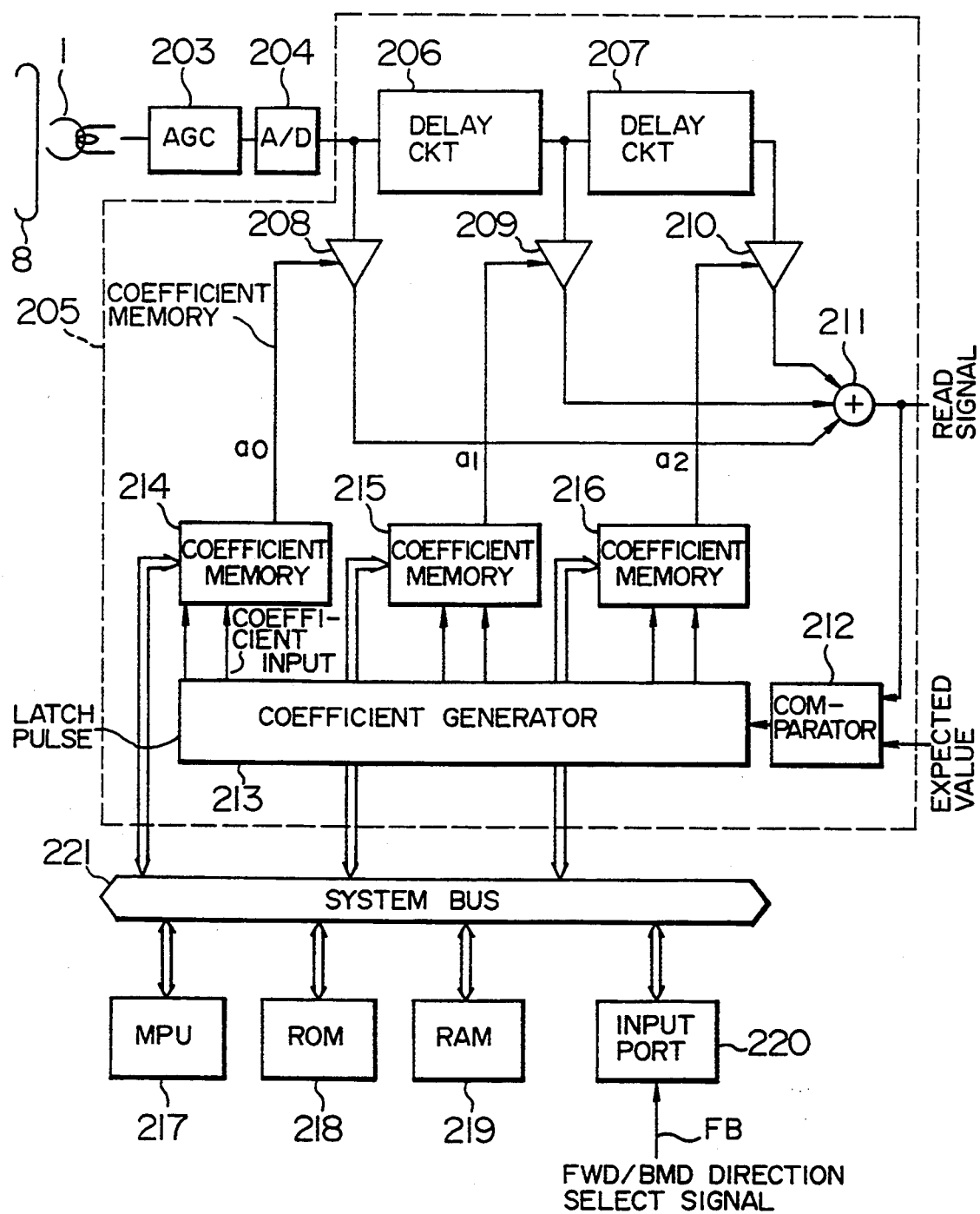
FIG. 10 is a block diagram showing the structure of a fourth embodiment according to the present invention.

FIG. 10 is a block diagram showing the structure of the fourth embodiment of the present invention. In FIG. 10, reference numeral 8 represents a magnetic tape having a plurality of tracks. Reference numeral 1 represents a magnetic head. Reference numeral 203 represents an automatic gain controlled (AGC) amplifier. Reference numeral 204 represents an analog/digital (A/D) converter. Reference numeral 205 represents an adaptive equalization circuit. Reference numerals 206 and 207 represent delay circuits. Reference numerals 208 to 210 represent multipliers. Reference numeral 211 represents an adder. Reference numeral 212 represents a comparator for comparing a read-out signal with an expected value. Reference numeral 213 represents a coefficient generator for generating coefficients to be used by the multipliers. Reference numerals 214 to 216 represent coefficient memories for storing coefficients. Reference numeral 217 represents an operation control circuit (MPU) for controlling the equalization circuit. Reference numeral 218 represents a read-only memory (ROM) for storing programs for MPU 217. Reference numeral 219 represents a random access memory (RAM) which is used as the working area of MPU 217. Reference numeral 220 represents an input port from which information representing the running direction of the magnetic tape is supplied to MPU 217. Reference numeral 221 represents a system bus used by MPU 217 for the control of respective circuits of this apparatus.

The magnetic head 1 reads magnetic information recorded on the magnetic tape 8 only from one track among a plurality of tracks, and converts it into an electric signal. The electric signal is then transformed into a signal having a constant amplitude by AGC 203 in order to absorb variation of signal amplitudes to be caused by the characteristics of the magnetic tape 8 and magnetic head 1. This stabilized signal is then inputted to A/D 204 which converts the inputted analog signal into a digital signal. This digital signal is inputted to the adaptive equalization circuit 205 constructed of digital circuit elements.

The adaptive equalization circuit 205 is constructed of: a non-recursive digital filter having the delay circuits 206 to 207, multipliers 208 to 210, and adder 211; the comparator 212 for comparing an output value with an expected value; the coefficient generator 213 for calculating coefficients for the multipliers 208 to 210 by using an error signal representing a difference between the output value and the expected value; and the coefficient memories 214 to 216 for temporarily storing coefficients which are read or written under the control of MPU 217.

The frequency characteristic of the non-recursive filter is determined by the coefficients for the multipliers 208 to 210, i.e., the coefficients a0 to a2 read from the coefficient memories 214 to 216. The coefficients a0 to a2 change until the output signal of the filter becomes equal to the expected value, and finally take certain values. Accordingly, the frequency characteristic of the adaptive equalization circuit is determined so that the read signal becomes equal to the expected value, thereby making constant the output characteristic of the equalization circuit relative to the read signal.

The coefficients a0 to a2 for the equalization circuit can be accessed by MPU 217 via the system bus 221. The coefficient memories 214 to 216 have the same structure except that each address referred to by MPU 217 is different. The structure of the coefficient memory 214 for example is shown in FIG. 11.

Figure 11:
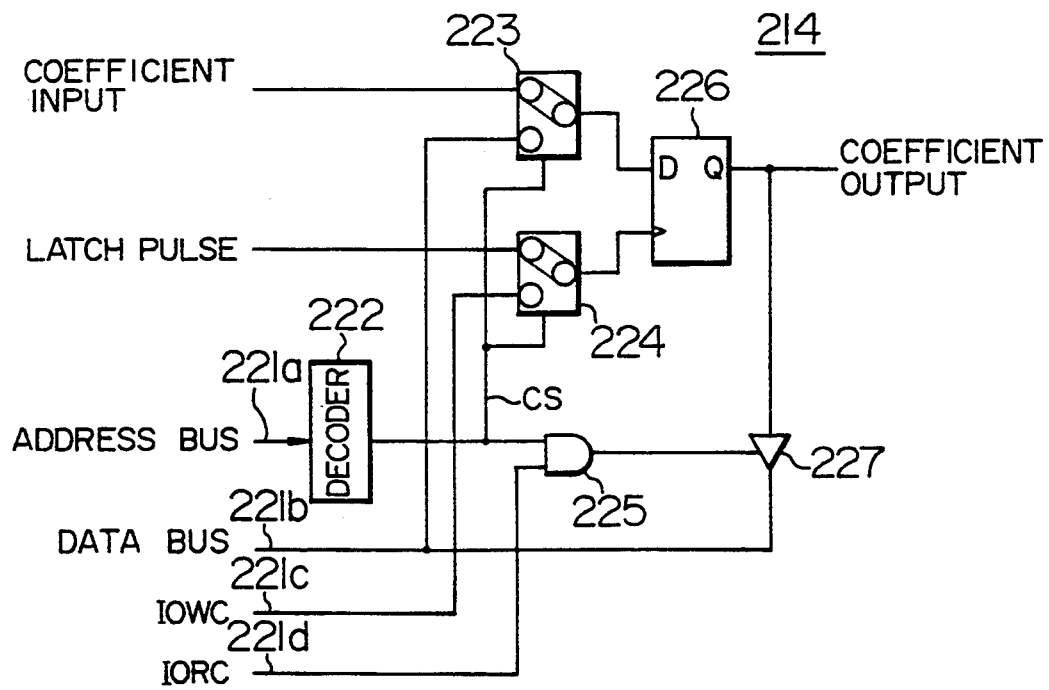
FIG. 11 is a logic circuit showing the structure of an embodiment of the coefficient memory used with the fourth embodiment.

Referring to FIG. 11, signal paths in the system bus 221 include an address bus 221a, a data bus 221b, an IOWC 221c, and an IORC 221d. Signals are outputted to these signal paths from MPU 217. Each coefficient memory 214 to 216 is assigned a different address. MPU 217 sends an address of each coefficient memory 214 to 216 to the address bus 221a.

A decoder 222 makes a select signal cs active if address information on the address bus 221 is an address of the coefficient memory 214, and if not, it makes the select signal cs inactive.

When the select signal cs becomes inactive, selectors 223 and 224 select an input coefficient and latch pulse, and sends them to a memory 226. The input coefficient is stored in the memory 226 in response to the latch pulse. The coefficient is then outputted to the multiplier 208.

When the select signal cs becomes active, MPU 217 makes one of the IORC signal and IOWC signal active in order to read a coefficient from the coefficient memory 214 and write a coefficient to the coefficient memory 214. In reading a coefficient, MPU 217 makes the select signal cs and IORC signal active. An AND gate 225 turns on a gate circuit 227 to output the coefficient onto the data bus 221b. MPU 217 receives the coefficient stored in the coefficient memory 214 and outputted onto the data bus 221b.

In writing a coefficient, MPU 217 makes the coefficient to be written output onto the data bus 221b, and makes the IOWC signal active. Since the select signal cs is active, the selectors 223 and 224 select the coefficient on the data bus 221b and a signal on the IOWC 221c, to store them in the memory 226. In this manner, the memory 226 stores the coefficient outputted under the control of MPU 217.

With the structure of the coefficient memory described above, it is possible for MPU 217 to access the coefficient memories 214 to 216.

Figure 12:
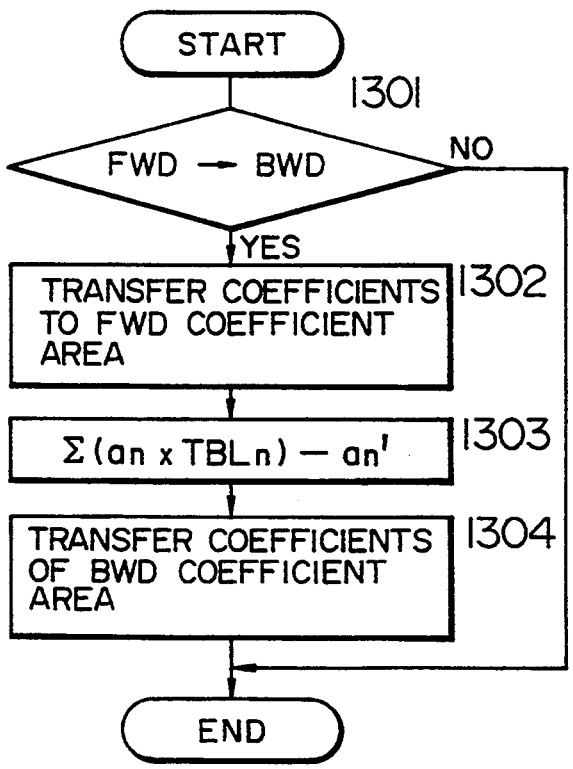
FIG. 12 is a flow chart illustrating the operation of MPU according to the fourth embodiment.

The read/write operation by MPU 217 is performed when a forward/backward select signal FB changes. MPU 217 monitors the state of the forward/backward select signal FB via the input port 220 in accordance with the program stored in ROM 218. When the direction changes from the forward direction to the backward direction, the coefficients for the backward direction are calculated from the coefficients for the forward direction, by using the procedure shown in FIG. 12.

When it is detected that the tape running direction changes from the forward (FWD) direction to the backward (BWD) direction (step 1301), MPU 217 causes the coefficients in the coefficient memories 214 to 216 to be transferred via the system bus 221 to an FWD coefficient area of RAM 219 (step 1302). Next, at step 1303 each of these coefficients an in the FWD coefficient area is multiplied by TBLn stored in advance in a calculation table and a sum of multiplied results is calculated, i.e., $\Sigma$ (an * TBLn)$\rightarrow$an'. The result an' is stored in a BWD coefficient area of RAM 219. The calculation table may be formed in ROM 218 or RAM 219.

For example, in obtaining a BWD coefficient a0', the FWD coefficients a0, a1, and a2 are multiplied by respective BWD coefficients TBL00, TBL01, and TBL02, and a sum of the multiplied results is calculated. Similarly, in obtaining BWD coefficients a1' and a2', other calculation tables TBL10 to TBL12, and TBL20 to TBL22 are used. The calculated coefficients BWD a0', a1', and a2' are transferred from the BWD coefficient area to the coefficient memories 214 to 216 under the control of MPU 217.

Figure 13A:
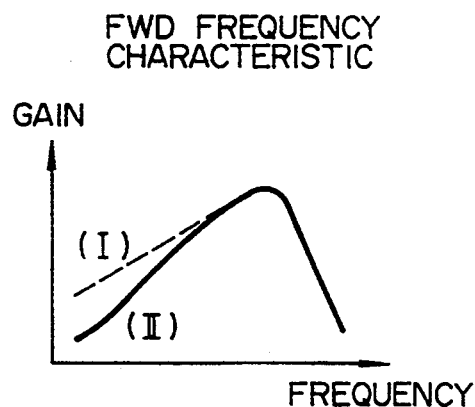
FIGS. 13A and 13B are graphs showing a difference of the frequency characteristic between the forward and backward tape running directions.
Figure 13B:
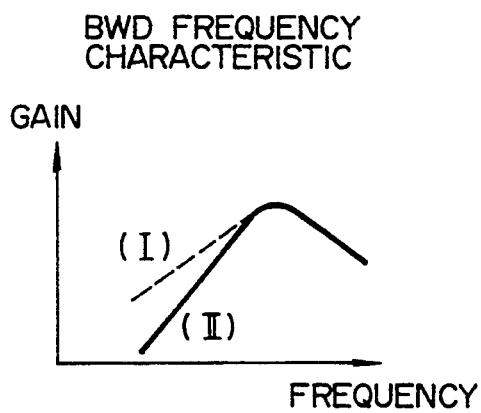

The value TBLn in the calculation table is used for obtaining a difference between the forward direction frequency characteristic and backward direction frequency characteristic. For example, as shown in FIG. 13, the forward and backward direction frequency characteristics of an equalization circuit are affected by the characteristics of magnetic tapes and heads as shown indicated by (I) and (II) in FIG. 13.

A difference of the characteristics between magnetic tapes and heads affect the forward and backward frequency characteristics to the same extent. Therefore, a difference between the forward and backward frequency characteristics becomes constant regardless of the difference of the characteristics of magnetic tapes and heads. This constant difference is represented by the values stored in the calculation table so that the backward direction frequency characteristic can be calculated from the forward direction frequency characteristic.

Figure 14:
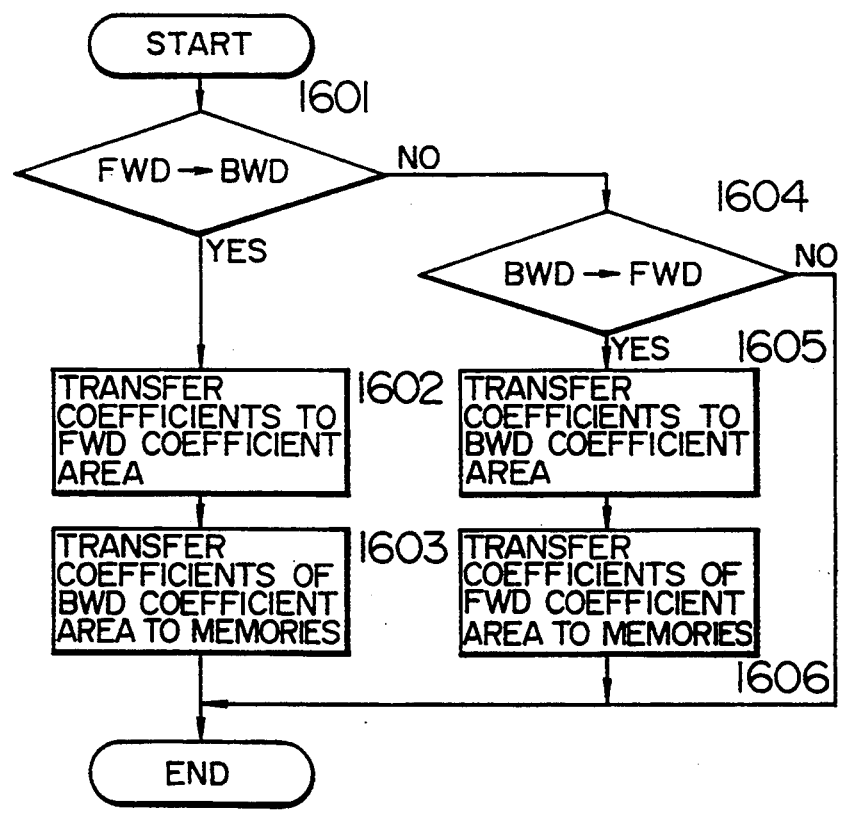
FIG. 14 is a flow chart explaining the operation of the forth embodiment.

This calculation is detailed in the flow chart of FIG. 14.

MPU 217 monitors the state of the forward/backward select signal FB via the input port 220 (step 1601). When the forward direction changes to the backward direction, the coefficients a0 to a2 are transferred to the FWD coefficient area of RAM 219 and the coefficients in the BWD coefficient area are transferred to the coefficient memories 214 to 216 (steps 1602 and 1603). Alternatively, when the backward direction changes to the forward direction (step 1604), the coefficients a0' to a2' are transferred to the BWD coefficient area, and the coefficients in the FWD area are transferred to the coefficient memories 214 to 216 (steps 1605 and 1606). If the forward/backward select signal FB does not change, MPU 217 does not execute this procedure (step 1604).

In this manner, when the forward/backward select signal FB changes, the coefficients stored in the coefficient memories 214 to 216 are calculated in accordance with the tape running direction to obtain new coefficients, and the calculated new coefficients are stored. Therefore, the learnt coefficients suitable for the tape running direction are stored in the FWD/BWD coefficient area of RAM 219, to help determine the proper frequency characteristic of the equalization circuit.

A modification of the fourth embodiment will be described with reference to FIG. 15.

This embodiment provides a simple adaptive equalization circuit for compensating signals from a plurality of tracks. For the simplicity of description, it is assumed that the characteristics of magnetic tape tracks and magnetic heads change uniformly.

Figure 15:
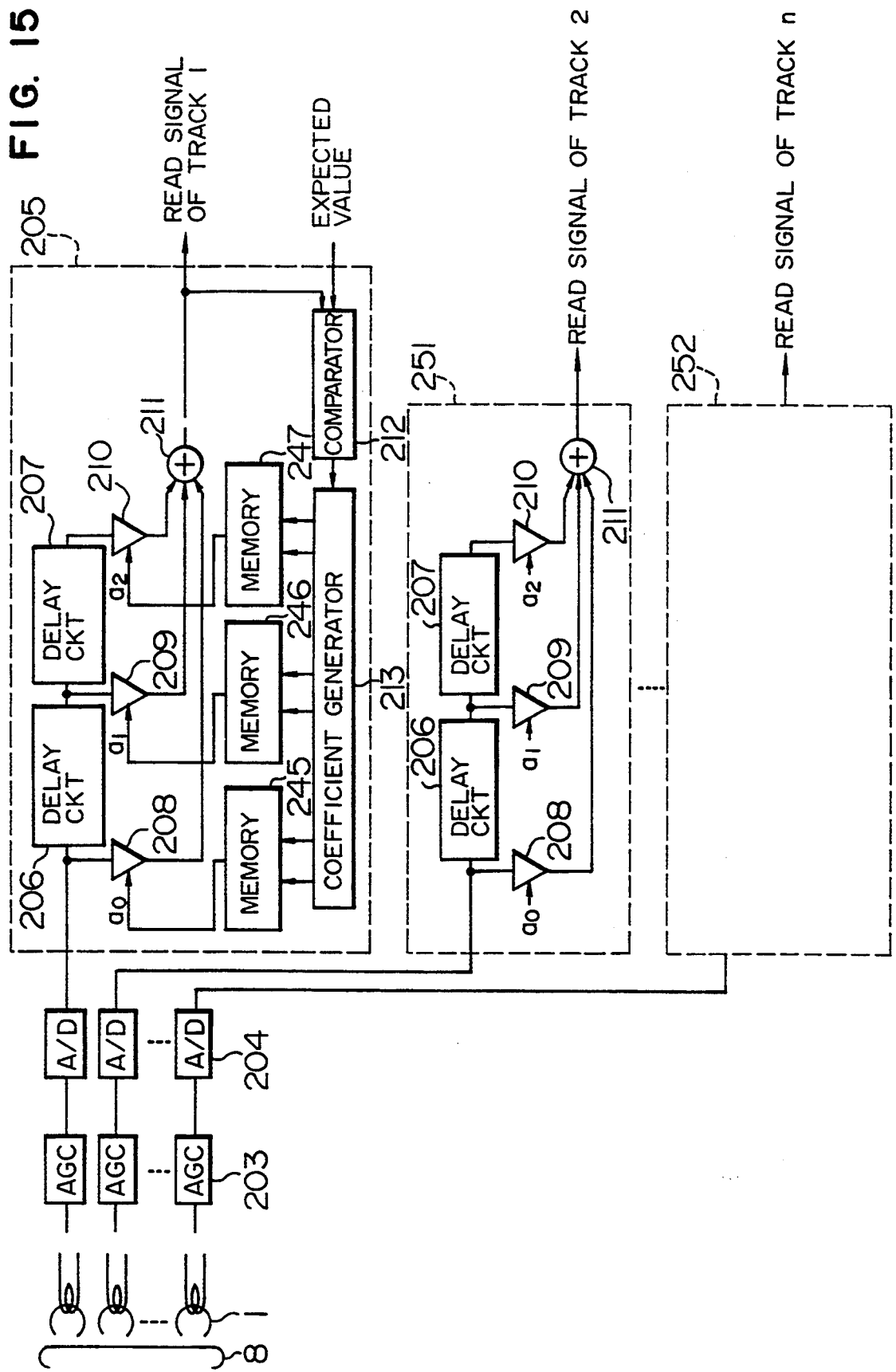
FIG. 15 is a block diagram showing the structure of a modification of the fourth embodiment.

FIG. 15 is a block diagram showing the structure of this embodiment.

In FIG. 15, reference numerals 251 and 252 represent non-recursive digital filters. Other elements are the same as those shown in FIG. 10.

Each magnetic head 2 is disposed in the longitudinal direction (tape running direction) of a magnetic tape 8. Each magnetic head 2 converts a magnetic signal of a corresponding one of a plurality of tracks into an electric signal. This electric signal is sent via an AGC 203 and A/D converter 204 to an equalization circuit to compensate the frequency characteristics of the magnetic tape 8 and magnetic head 1. For the first track, the equalization circuit 205 is used which has the same structure as described previously. Namely, the coefficients a0 to a2 for the multipliers 208 to 210 are changed so as to make the read signal coincide with the expected value. The coefficients a0 to a2 eventually have the values suitable for compensating the frequency characteristics of the magnetic tape 8 and head 1.

Since the frequency characteristics of the magnetic tape 8 tracks and magnetic heads 1 are assumed to change uniformly, the equalization circuits for other tracks have the same structure as the equalization circuit 205 for the first track. Specifically, each of the non-recursive digital filters 251 and 252 is constructed of delay circuits 206 and 207, multipliers 208 to 210, and an adder 211. As the coefficients for the multipliers 208 to 210, the coefficients a0 to a2 for the first track are used.

The equalization circuit for each track therefore has the same frequency characteristic which absorbs the difference of the frequency characteristics between magnetic tape tracks and magnetic heads.

According to this embodiment, all the tracks are not required to have their own equalization circuit, reducing the number of comparators, coefficient generators and memories.

We claim:

1. An adaptive equalizing data reproducing circuit comprising:
    a data reading means for reading data from a recording medium;
    an adaptive equalizing means for optimizing a waveform of a read signal from said data reading means;
    a first expected value generating means for discriminating an output signal from said adaptive equalizing means to generate a first expected value for a waveform of a discriminated signal;
    a format detecting means for detecting a specified pattern of a signal written on said recording medium from said read signal;
    a monitor means for monitoring whether a waveform of said read signal is periodical or not based on an output of said format detecting means;
    a second expected value generating means for generating a second expected value from said waveform of said read signal monitored by said monitor means;
    an error detecting means for generating an error signal representing a difference between an output of said adaptive equalizing means and said first expected value of said first expected value generating means, for adaptive equalize and generating an error signal representing a difference between said output of said adaptive equalizing means and said second expected value of said second expected value generating means, for adaptive learning and feeding said error signal back to said adaptive equalizing means; and
    a select means for selecting said error signal for adaptive equalizing or said error signal for adaptive learning as a feedback output applied to said adaptive equalizing means in accordance with said output of said format detecting means,
    wherein multiplication factors of said multipliers of said adaptive equalizing means are changed in accordance with said error signal applied thereto.

2. A data reproducing circuit according to claim 1, further comprising:

an abnormality detecting circuit for detecting an abnormality of said read signal based on an output of said second expected value generating means; and a stop means responsive to an output of said abnormality detecting means for stopping feeding-back of said error signal to said adaptive equalizing means by said error detecting means.

3. An adaptive equalizing data reproducing circuit according to claim 1, wherein said adaptive equalizing means further comprising:

a coefficient circuit for setting a multiplication coefficient to each said multiplier; and an adder circuit for adding together outputs of said multipliers, wherein an equalization characteristic of said adaptive equalizing means is determined by said multiplication coefficients set by said coefficient circuit means.

4. An adaptive equalizing data reproducing circuit comprising:

a data reading means for reading data from a recording medium;

an adaptive equalizing means for optimizing a waveform of a read signal from said data reading means;

a first expected value generating means for discriminating an output signal from said adaptive equalizing means to generate a first expected value for a waveform of a discriminated signal;

a format detecting means for detecting a specified pattern of a signal written on said recording medium from said read signal;

a monitor means for monitoring whether a waveform of said read signal is periodical or not based on an output of said format detecting means;

a second expected value generating means for generating a second expected value from said waveform of said read signal monitored by said monitor means;

an error detecting means for generating an error signal representing a difference between said output of said adaptive equalizing means and said first expected value of said first expected value generating means, for adaptive equalizing and generating an error signal representing a difference between said output of said adaptive equalizing means and said second expected value of said second expected value generating means, for adaptive learning and feeding said error signal back to said adaptive equalizing means; and a select means for selecting said error signal for adaptive equalizing or said error signal for adaptive learning as a feedback output applied to said adaptive equalizing means in accordance with said output of said format detecting means, a feedback percentage changing means for changing a percentage of said feedback, said feedback percentage changing means setting, when said format detecting means detects a particular signal pattern, a feedback percentage to a predetermined value which is larger than a value of a predetermined normal feedback percentage.

5. A data reproducing circuit according to claim 4, wherein said expected value generating means includes memory means for storing a standard expected value, and data stored in said memory means is outputted as said expected value when said feedback percentage is set to a large value.

6. An adaptive equalizing data reproducing circuit according to claim 4, wherein said adaptive equalizing means further comprising:

a coefficient circuit for setting a multiplication coefficient to each said multiplier; and an adder circuit for adding together outputs of said multipliers, wherein an equalizing factor of said adaptive equalizing means is determined by said multiplication coefficients set by said coefficient circuit.

7. A data reproducing circuit according to claim 6, further comprising:

a coefficient setting circuit for setting a coefficient to said coefficient circuit; and storage means for storing said coefficient to be set, wherein said setting circuit reads an initial value of said coefficient stored in said storage means and sets said initial value to said coefficient circuit when the data reproducing circuit starts operating.

8. A data reproducing circuit according to claim 7, further comprising mode detecting means for detecting an operation mode of the data reproducing circuit, said coefficient setting circuit reads said coefficient from said storage means and renews said coefficient of said coefficient circuit when said operation mode changes.

* * * * *